(12) United States Patent
Kim et al.

(10) Patent No.: US 11,050,126 B2
(45) Date of Patent: Jun. 29, 2021

(54) BATTERY INCLUDING ELECTRODE TAB HAVING FLAT SURFACE

(71) Applicant: Samsung Electronics Co., Ltd., Gyeonggi-do (KR)

(72) Inventors: Shihyun Kim, Gyeonggi-do (KR); Juneyoung Hur, Gyeonggi-do (KR); Sihoon Youm, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 268 days.

(21) Appl. No.: 15/922,015

(22) Filed: Mar. 15, 2018

(65) Prior Publication Data
US 2018/0269460 A1 Sep. 20, 2018

(30) Foreign Application Priority Data
Mar. 16, 2017 (KR) .......... 10-2017-0033381

(51) Int. Cl.
*H01M 50/531* (2021.01)
*H01M 10/04* (2006.01)
(Continued)

(52) U.S. Cl.
CPC ......... *H01M 50/531* (2021.01); *H01M 4/139* (2013.01); *H01M 10/0431* (2013.01); *H01M 10/0436* (2013.01); *H01M 10/0481* (2013.01); *H01M 50/528* (2021.01); *H01M 50/543* (2021.01); *H05K 5/0017* (2013.01); *H05K 5/0086* (2013.01); *H01M 10/0587* (2013.01); *H01M 2220/30* (2013.01)

(58) Field of Classification Search
CPC ............ H01M 2/26; H01M 2/22; H01M 2/30; H01M 4/139; H01M 10/0431; H01M 10/0436; H01M 10/0481; H01M 10/0587; H01M 50/531; H01M 50/528; H01M 50/543; H05K 5/0017; H05K 5/0086
See application file for complete search history.

(56) References Cited

U.S. PATENT DOCUMENTS

| 6,117,589 A | 9/2000 | Satou et al. |
| 2001/0012583 A1 | 8/2001 | Barber et al. |

(Continued)

FOREIGN PATENT DOCUMENTS

| EP | 2 733 778 A2 | 5/2014 |
| WO | 99/08333 A1 | 2/1999 |

OTHER PUBLICATIONS

European Search Report dated Jun. 5, 2018.
International Search Report dated Jun. 28, 2018.

*Primary Examiner* — Jimmy Vo
(74) *Attorney, Agent, or Firm* — Cha & Reiter, LLC

(57) ABSTRACT

A battery according to an embodiment may comprise an electrode assembly, said electrode assembly comprising an electrode substrate comprising a first area and a second area; an active material deposited on the first area of the electrode substrate; and an electrode tab attached to the second area of the electrode substrate, wherein the electrode tab comprises a bonding surface having at least one protrusion making contacting with a bonding location of the second area of the electrode substrate, wherein a surface opposite to the bonding surface and a surface opposite the bonding location are substantially flat.

16 Claims, 14 Drawing Sheets

(51) Int. Cl.
  *H01M 4/139* (2010.01)
  *H01M 50/528* (2021.01)
  *H01M 50/543* (2021.01)
  *H05K 5/00* (2006.01)
  *H01M 10/0587* (2010.01)

(56) References Cited

U.S. PATENT DOCUMENTS

| | | |
|---|---|---|
| 2006/0040181 A1 | 2/2006 | Kim et al. |
| 2007/0231701 A1 | 10/2007 | Lee |
| 2009/0023059 A1 | 1/2009 | Kinoshita et al. |
| 2011/0129718 A1 | 6/2011 | Lee |
| 2014/0147716 A1 | 5/2014 | Oh et al. |
| 2014/0255768 A1* | 9/2014 | Jang .................. H01M 50/147 |
| | | 429/179 |
| 2014/0292284 A1 | 10/2014 | Sawada |
| 2014/0342194 A1 | 11/2014 | Wang et al. |
| 2015/0064519 A1 | 3/2015 | Hong |
| 2015/0140396 A1* | 5/2015 | Yamazaki ........... H01M 2/0212 |
| | | 429/127 |
| 2017/0018752 A1 | 1/2017 | Kim et al. |

* cited by examiner

US 11,050,126 B2

BATTERY INCLUDING ELECTRODE TAB HAVING FLAT SURFACE

CROSS-REFERENCE TO RELATED APPLICATION(S)

This application claims priority from and the benefit under 35 U.S.C. § 119(a) of Korean Patent Application No. 10-2017-0033381 filed on Mar. 16, 2017, which is hereby incorporated by reference for all purposes as if fully set forth herein.

BACKGROUND

Field

This disclosure relates to a battery having an electrode assembled with an electrode substrate and an electrode tab, a production method thereof, and an electronic device including the battery.

Description of Related Art

Reduction in volume and increased capacity is a developing trend for batteries installed in an electronic device. The batteries are manufactured in various methods, which may include packing in a "jelly roll."

The above information is presented as background information only to assist with an understanding of the present disclosure. No determination has been made, and no assertion is made, as to whether any of the above might be applicable as prior art with regard to the present disclosure.

SUMMARY

Configuring a battery for an electronic device where components are disposed integrally in a small space can generate unpredictable interference between electrodes and physical, electrical, or chemical interference with membranes and other members.

According to various embodiments of the present disclosure, an electrode assembly formed with uniform and smooth surfaces of welded parts of an electrode substrate and an electrode tab, and a production method thereof, can be provided that may reduce physical interference.

A battery according to an embodiment may comprise an electrode assembly, said electrode assembly comprising an electrode substrate comprising a first area and a second area; an active material deposited on the first area of the electrode substrate; and an electrode tab attached to the second area of the electrode substrate, wherein the electrode tab comprises a bonding surface having at least one protrusion making contacting with a bonding location of the second area of the electrode substrate, wherein a surface opposite to the bonding surface and a surface opposite the bonding location are substantially flat.

An electronic device according to an embodiment comprises a housing; a display partially accommodated in the housing; and a battery partially accommodated in the housing, wherein the battery comprises an electrode assembly, the electrode assembly comprising an electrode substrate comprising a first area and a second area; an active material deposited on the first area of the electrode substrate; and an electrode tab attached to the second area of the electrode substrate, wherein the electrode tab comprises a bonding surface having at least one protrusion contacting a bonding location of the second area of the electrode substrate, and wherein a surface opposite to the bonding surface of the electrode tab and a surface opposite to the bonding location are substantially flat.

A method for manufacturing a battery including an anode assembly, a cathode assembly, and a membrane disposed between the anode assembly and the cathode assembly according to an embodiment of the present disclosure may comprise the operations of: supplying an electrode substrate to be used for a pole assembly corresponding to the anode assembly and the cathode assembly, depositing an active material in a partial area of the electrode substrate, and attaching an electrode tab in another area of the electrode substrate. The operation of attaching an electrode tab may comprise the operations of forming at least one protrusion in bonding surface of the electrode tab opposite to a substantially flat surface; and combining the at least one protrusion with the electrode substrate in order to attach a bonding surface of the electrode tab to the electrode substrate.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
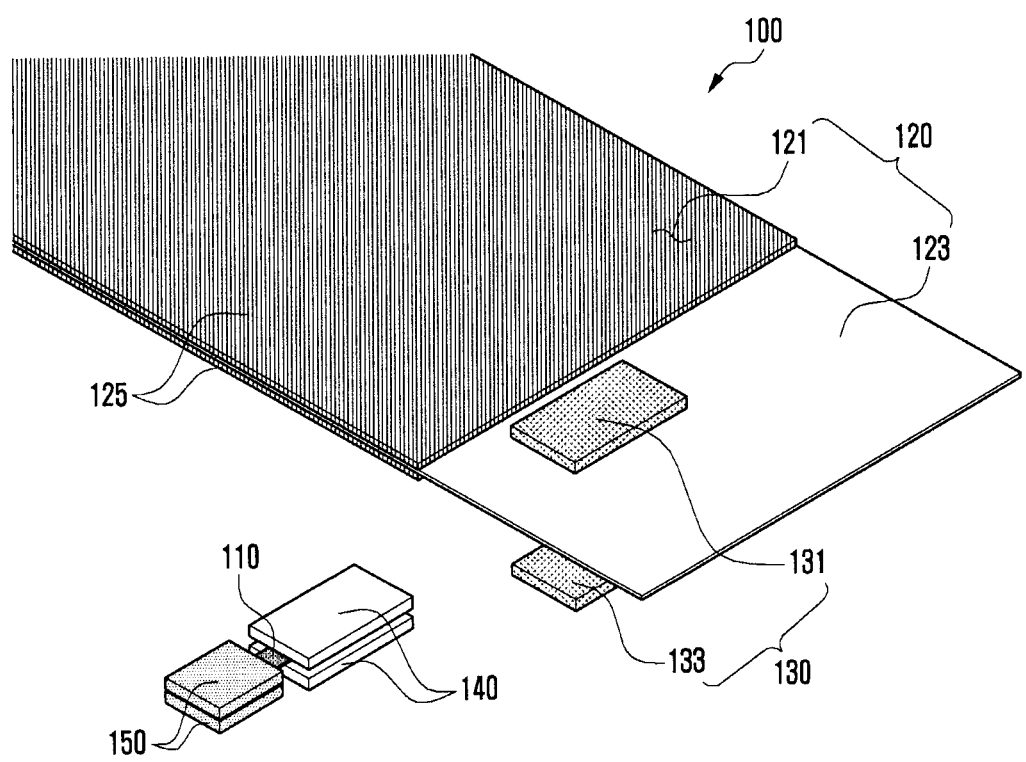
FIGS. 1 to 3 illustrate a procedure of manufacturing an electrode assembly according to an embodiment.

The expressions such as "include" and "may include" which may be used in the present disclosure denote the presence of the disclosed functions, operations, and constituent elements and do not limit one or more additional functions, operations, and constituent elements. In the present disclosure, the terms such as "include" and/or "have" may be construed to denote a certain characteristic, number, step, operation, constituent element, component or a combination thereof, but may not be construed to exclude the existence of or a possibility of addition of one or more other characteristics, numbers, steps, operations, constituent elements, components or combinations thereof.

Furthermore, in the present disclosure, the expression "and/or" includes any and all combinations of the associated listed words. For example, the expression "A and/or B" may include A, may include B, or may include both A and B.

As used herein, the terms "1st" or "first" and "2nd" or "second" may use corresponding components regardless of importance or order and are used to distinguish a component from another without limiting the components. For example, the above expressions do not limit the sequence and/or importance of the elements. The above expressions are used merely for the purpose to distinguish an element from the other elements. For example, a first user device and a second user device indicate different user devices although both of them are user devices. For example, a first element could be termed a second element, and similarly, a second element could be also termed a first element without departing from the scope of the present disclosure. Moreover, no particular order shall be inferred unless explicitly stated. For example, a "first" condition does not necessarily occur prior to a "second" condition.

In the case where a component is referred to as being "connected" or "accessed" to other component, it should be understood that component the component does not have to be directly connected or accessed to the other component, but also there may exist another component between them. Meanwhile, in the case where a component is referred to as being "directly connected" or "directly accessed" to another component, it should be understood that there is no component therebetween. The terms used in the present disclosure are only used to describe specific various embodiments, and are not intended to limit the present disclosure. As used herein, the singular forms are intended to include the plural forms as well, unless the context clearly indicates otherwise. Singular forms are intended to include plural forms unless the context clearly indicates otherwise.

An electronic device according to the present disclosure may be a communication device. For example, the device can include any or a combination of at least one of a smartphone, a tablet Personal Computer (PC), a mobile phone, a video phone, an e-book reader, a desktop PC, a laptop PC, a netbook computer, a Personal Digital Assistant (PDA), a Portable Multimedia Player (PMP), a digital audio player, a mobile medical device, an electronic bracelet, an electronic necklace, an electronic accessory, a camera, a wearable device, an electronic clock, a wrist watch, home appliances (for example, an air-conditioner, vacuum, an oven, a microwave, a washing machine, an air cleaner, and the like), an artificial intelligence robot, a TeleVision (TV), a Digital Video Disk (DVD) player, an audio device, various medical devices (for example, Magnetic Resonance Angiography (MRA), Magnetic Resonance Imaging (MRI), Computed Tomography (CT), a scanning machine, a ultrasonic wave device, or the like), a navigation device, a Global Positioning System (GPS) receiver, an Event Data Recorder (EDR), a Flight Data Recorder (FDR), a set-top box, a TV box (for example, Samsung HomeSync™, Apple TV™, or Google TV™), an electronic dictionary, vehicle infotainment device, an electronic equipment for a ship (for example, navigation equipment for a ship, gyrocompass, or the like), avionics, a security device, electronic clothes, an electronic key, a camcorder, game consoles, a Head-Mounted Display (HMD), a flat panel display device, an electronic frame, an electronic album, furniture or a portion of a building/structure that includes a communication function, an electronic board, an electronic signature receiving device, a projector, and the like. It is obvious to those skilled in the art that the electronic device according to the present disclosure is not limited to the aforementioned devices.

Figure 2:
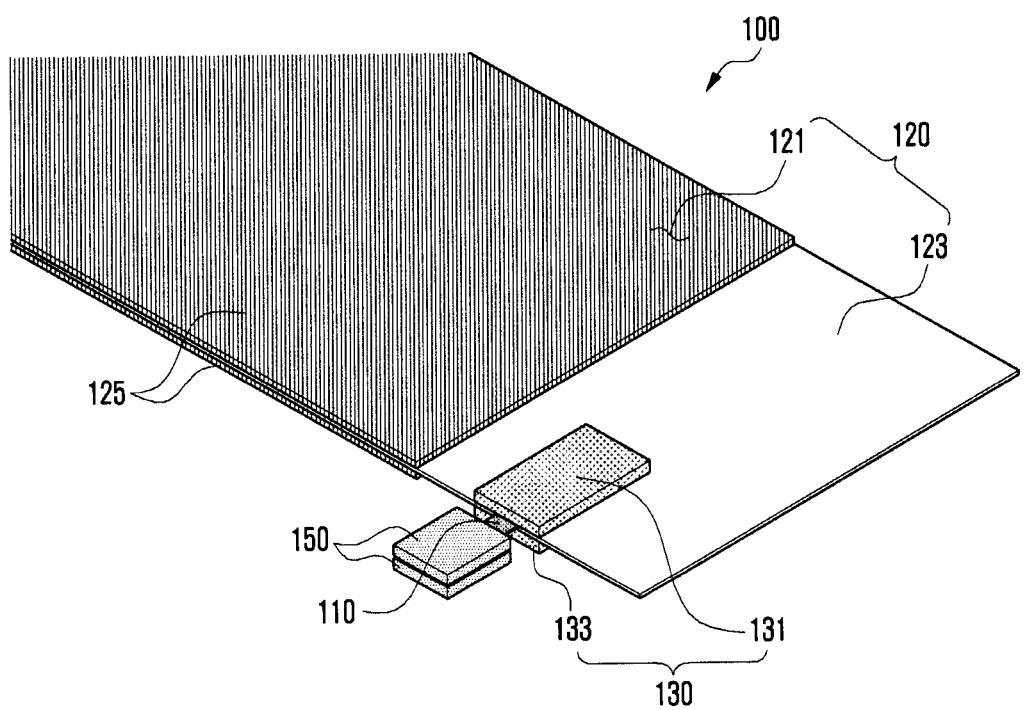
Figure 3:
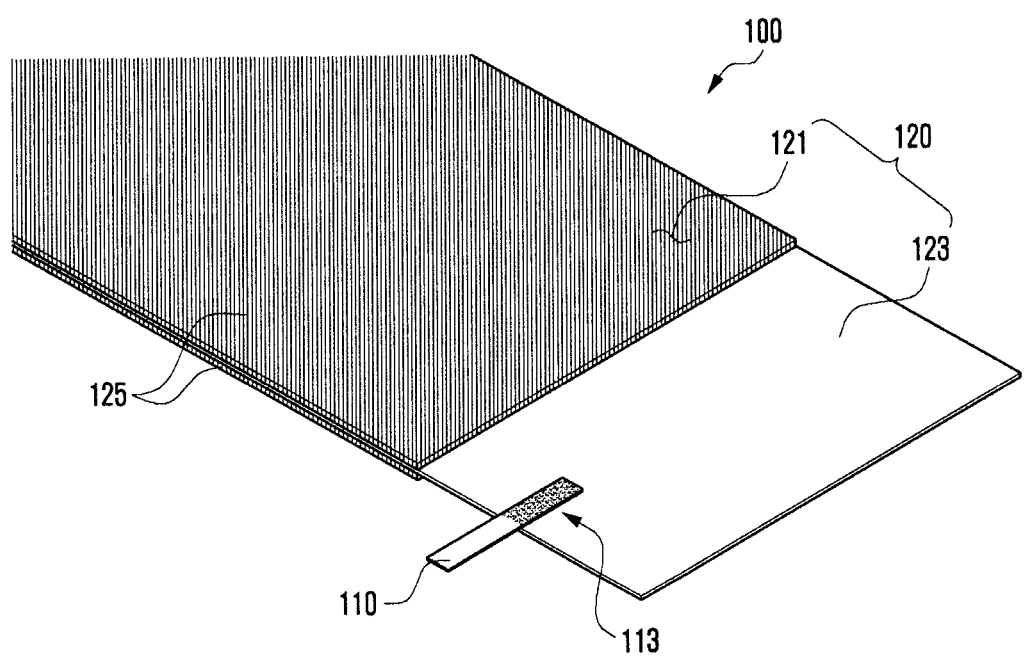

FIGS. 1 to 3 illustrate the manufacture of an electrode assembly 100 wherein a bonding part 113 of an electrode substrate 120 and an electrode tab 110 according to an embodiment of the present disclosure (refer to FIG. 3).

Figure 4:
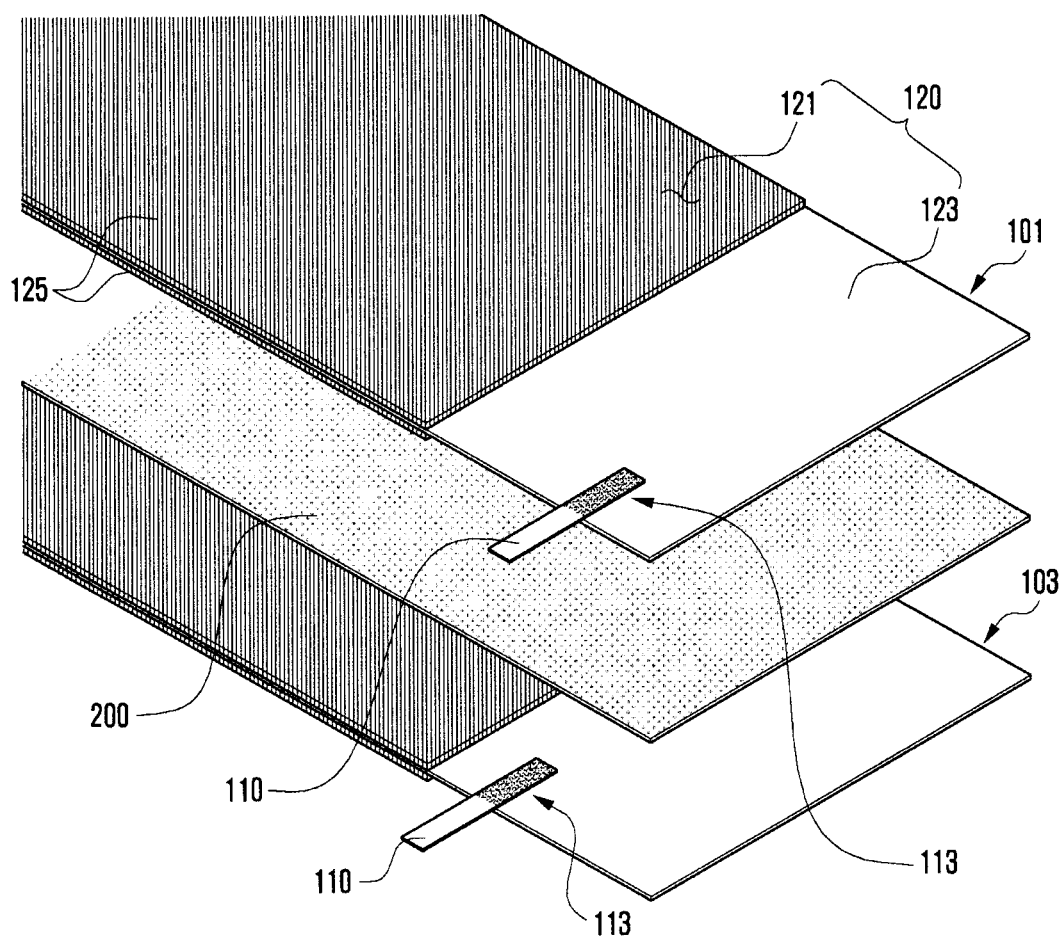
FIG. 4 illustrates an anode assembly, membrane, and cathode assembly according to an embodiment.

With reference to FIG. 1, the electrode assembly 100 according to an embodiment of the present disclosure may comprise a selected one of an anode assembly 101 or a cathode assembly 103 (refer to FIG. 4). The electrode assembly 100 may include an electrode tab 110, electrode substrate 120, and active material 125. The bonding part 113 shall refer to the bonding surface 113a (refer to FIG. 7) contacting and combining the electrode tab 110 and the electrode substrate 120, and surface 113b (refer to FIG. 7) opposite to the bonding surface 113a. In more detail, surface 113b may refer to a surface opposite to the bonding surface 113a on the electronic tab 110. In the process of describing the present disclosure, the bonding part 113, bonding surface 113a, and surface opposite the bonding surface 113b may include respectively a welding part 113, a welding surface 113a, and a surface opposite to the welding surface 113b according to an embodiment of the present disclosure (refer to FIG. 3 and FIG. 7).

The electrode substrate 120 forms a basic frame of an electrode and the active material 125 can be deposited in a first area 121 of the electrode substrate 120. The type of battery (e.g., lithium-ion battery, nickel-hydride battery, and nickel-cadmium battery) may differ according to the type of deposited active material 125, and the polarity (e.g., anode and cathode) can be changed accordingly. For example, the active material 125 may include at least one material selected from the groups of lithium transition metal oxides such as lithium cobalt oxide, lithium nickel oxide, lithium nickel cobalt oxide, lithium nickel cobalt aluminum oxide, lithium nickel cobalt manganese oxide, lithium manganese oxide, and lithium iron phosphate; nickel sulfides; copper sulfides; sulfur; iron oxides; metals; carbon-containing materials; metal oxides; and lithium metal nitrides and vanadium oxides.

The electrode substrate 120 may be formed with a metallic material having a conductivity, and it may include at least one metal selected from the group of copper, stainless steel, nickel, aluminum, and titanium. Further, a plating process can be applied to a surface of the electrode substrate 120 according to the type of active material 125 to be deposited to the electrode substrate 120.

An electrode tab sheet having a plate shape can be supplied with a roll formed by winding a sheet, and it can be used after unwinding the roll and cutting into a predetermined size. The cut electrode tab 110 can be transported by an electrode tab transfer device 150, and processed for a welding protrusion 111 shown in the following FIGS. 8 to 11 by pressing a welding part 113 of an electrode tab (refer to FIG. 3 and FIG. 7) with a jig 140 formed with protrusions. The welding part 113 of the electrode tab may mean a welding surface 113a of the electrode tab 110 and the opposite surface 113b (refer to FIG. 3 and FIG. 7).

The electrode tab 110 processed with a welding protrusion 111 can be settled in location of the second area of the electrode substrate 123" (now referred to as the "bonding location"), and an electrode assembly 100 combining the electrode tab 110 and electrode substrate 120 can be formed by welding the settled part. The electrode tab 110 may be formed with a material identical or similar to the electrode substrate 120 for the uniformity of the opposite surface 113b on the welding part 113 and a lower surface of the electrode 123' directly under the bonding/welding surface 113 (now referred to as the "surface opposite the bonding location" 123') (refer to FIG. 7), which will be described later. For example, the electrode tab 110 may be formed with an aluminum or copper material.

FIG. 2 illustrates a procedure where an ultrasonic welding device 130 welds the electrode tab 110 onto the electrode substrate 120 according to an embodiment of the present disclosure. According to an embodiment of the present disclosure, when the electrode tab transfer device 150 settles the welding surface 113a (refer to FIG. 7) of the electrode tab 110 to a location 123" of the second area 123 (now referred to as a bonding location 123") of the electrode substrate 120, the ultrasonic welding device 130 can combine the electrode tab 110 and the electrode substrate 120 by pressing the settled part.

The ultrasonic welding device 130 may include a horn 131 and an anvil 133. Surfaces of the horn 131 and the anvil 133 contacting with the electrode tab 110 or the electrode substrate 120 may be formed in a flat shape without having a concave-convex or an irregular protrusion.

By using the jig 140 described above, a welding protrusion 111 is formed on the welding surface 113a (refer to FIG. 7) of the electrode tab, and if the welding surface 113a of the electrode tab 110 formed with the welding protrusion(s) 111 is pressed by the horn 131 and the anvil 133 so that the welding protrusion(s) 111 settle on the electrode substrate 120, the surface opposite to the welding surface 113b (refer to FIG. 7) can be formed in substantially flat shapes.

FIG. 3 illustrates an electrode assembly 100 having an electrode substrate 120 and an electrode tab 110 welded by an ultrasonic welding device 130 according to an embodiment of the present disclosure. In the procedure of welding the electrode substrate 120 and the electrode tab 110, the welding protrusion 111 formed on the electrode tab 110 can penetrate or damage the surface of the electrode substrate 120; however, the surface opposite the bonding surface 113b (refer to FIG. 7) and the lower surface of the electrode 120' directly under the bonding/welding surface 113 can be formed uniformly and smoothly by using the horn 131 and anvil 133 such that each have a flat shape, In certain embodiments, the surface opposite the bonding surface 113b and the lower surface of the electrode 120' directly under the bonding/welding surface 113 can be substantially flat. In certain embodiments, the bonding surface 113b and the lower surface of the electrode 120' directly under the bonding/welding surface 113 can form a plane having two dimensions, wherein deviation of the surface is no more than 10% of one of the two dimensions.

Although FIG. 3 illustrated that the electrode substrate 120 is divided into a first area 121 deposited with an active material 125 and a second area 123 attached with the electrode tab 110, the present disclosure is not limited to this example.

For example, the first area 121 can be set away from the bonding location 123" (refer to FIG. 7) of the electrode substrate, and accordingly the active material 125 can be deposited in the first area 121 away the bonding location 123" (refer to FIG. 7) of the electrode substrate 120.

FIG. 4 illustrates an anode assembly 101, membrane 200, and cathode assembly 103 according to an embodiment of the present disclosure.

As described above, the anode assembly 101 and/or the cathode assembly 103 may include an electrode substrate 120, active material 125, and electrode tab 110. The anode assembly 101 and the cathode assembly 103 can be distinguished according to the type of active material 125.

A membrane 200 may be disposed between the anode assembly 101 and the cathode assembly 103, and the anode assembly 101, cathode assembly 103, and membrane 200 can be packaged to a battery by combining in a form shown in the following FIG. 8.

Figure 5:
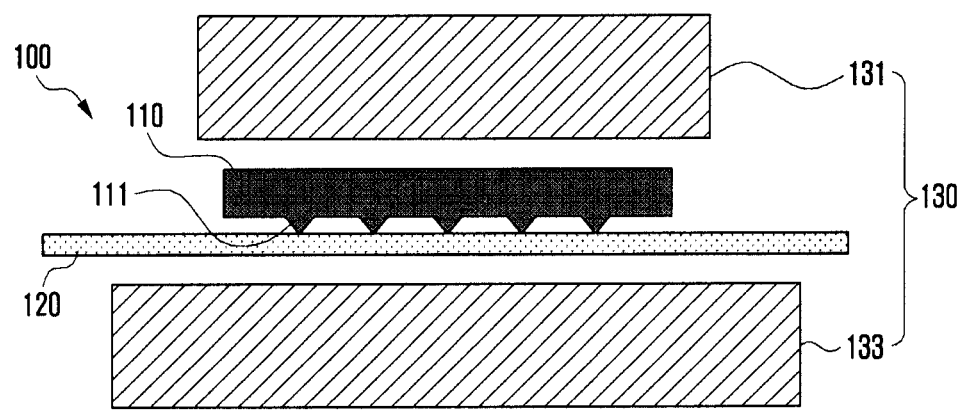
FIGS. 5 to 7 illustrate a conceptual procedure of welding an electrode tab and an electrode substrate according to an embodiment.
Figure 6:
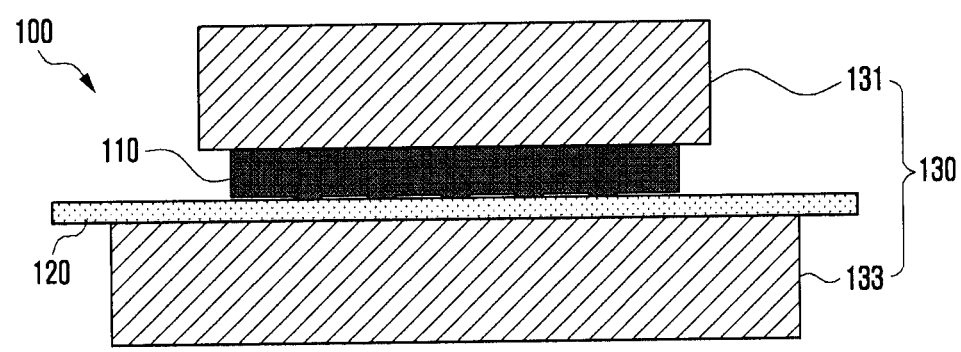
Figure 7:
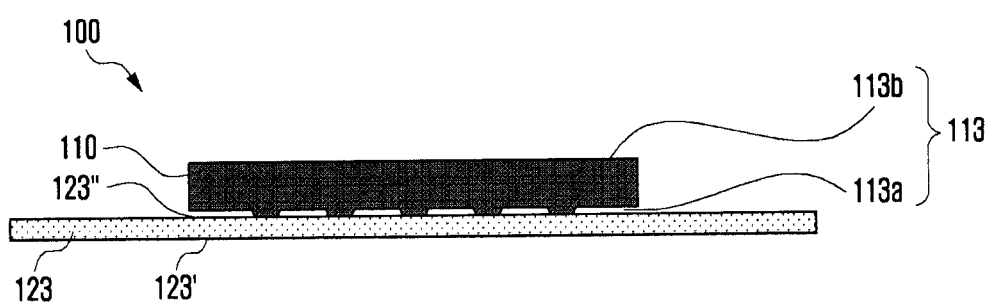

FIG. 5 and FIG. 6 are conceptual drawings illustrating a procedure of welding an electrode tab 110 and an electrode substrate 120 according to an embodiment of the present disclosure, and FIG. 7 illustrates a cross section of the electrode tab 110 and the electrode substrate 120 welded together.

With reference to FIG. 5 and FIG. 6, a welding surface 113a (refer to FIG. 7) of the electronic tab 110 formed with a welding protrusion 111 can be settled on a surface of the electrode substrate 120, and the settled part can be welded by pressing with a horn 131 and an anvil 133.

The welding protrusion 111 may be formed at a bonding surface 113a of the electrode tab 110 facing the electrode substrate 120. The welding protrusion 111 strengthens the shear stress of a bonding force between surfaces 113a and bonding location 123". In the case of bonding force between flat surfaces without the welding protrusion 111, a frictional force might be the only force to strengthen the shear stress. However, if the welding protrusion 111 is formed like an electrode tab 110 according to an embodiment of the present disclosure, the welding protrusion 111 penetrates or deforms the bonding location 123", and thereby strengthening the shear stress can take place by adding a physical bonding force to the frictional force.

However, the welding protrusion 111 might be formed at only the bonding surface of the electrode tab 110 contacting the electrode substrate 120 at bonding location 123" because the welding protrusion 111 can influence other adjacent electrodes in the process of packing the electrode tab 110, the surface opposite the welding surface 113b, and the surface opposite the bonding location 123' (refer to FIG. 7) by winding in a jelly roll shape.

With reference to FIG. 7, the surface opposite the bonding surface 113b can be formed uniformly and smoothly, even though the welding protrusion 111 formed at the welding surface 113a of the electrode tab 110 penetrates deforms the bonding location 123' in the process of pressing with a horn 131 and an anvil 133. Like this, an influence of the surface opposite the bonding surface 113b and the surface opposite the bonding location 123' to other electrodes can be reduced in the process of winding for a battery package.

FIGS. 8 to 11 illustrate shapes of protrusions of the electrode tab 110 according to various embodiments of the present disclosure. The protrusion of the electrode tab 110 may correspond to a welding protrusion 111.

Figure 8:
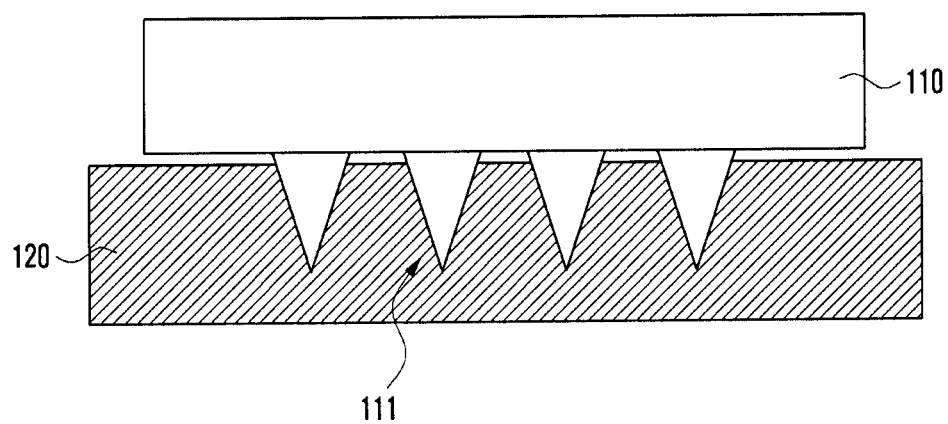
FIGS. 8 to 11 illustrate shapes of protrusions of an electrode tab according to various embodiments.

FIG. 8 illustrates protrusions 111 in case that the height of the protrusion 111 is formed smaller than the thickness of the electrode substrate 120 according to an embodiment of the present disclosure. If the height of the protrusion 111 is formed smaller than the thickness of the electrode substrate 120, the possibility of the protrusion 111 penetrating and damaging the electrode substrate 120 may decrease and the surface opposite the welding surface 113a and the surface opposite the bonding location 123' (refer to FIG. 7) can be formed substantially flat.

Figure 9:
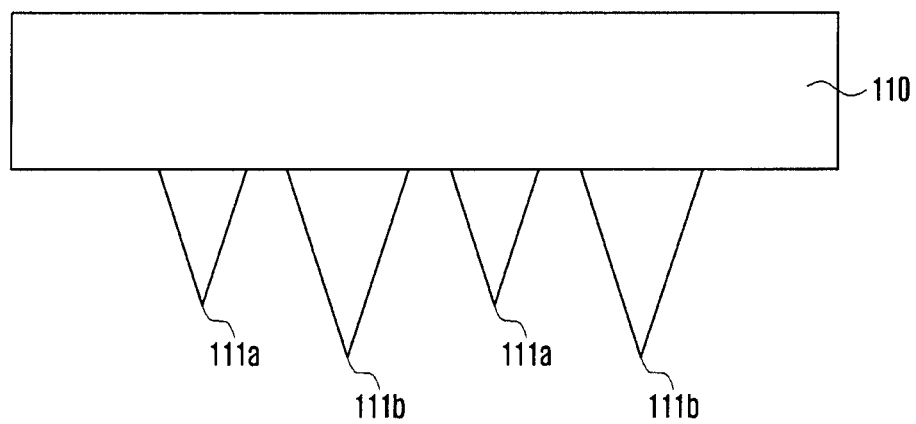

FIG. 9 illustrates protrusions 111 in case that the lengths of protrusions are formed variously according to an embodiment of the present disclosure.

For example, the protrusion 111 may include a first protrusion set 111a having a first length and a second protrusion set 111b having a second length. The first protrusion set 111a or the second protrusion set 111b may include at least one protrusion.

A bonding force can be adjusted by disposing protrusions 111 having different lengths and adjusting the depth of welding the electrode tab 110 and the electrode substrate 120.

Figure 10:
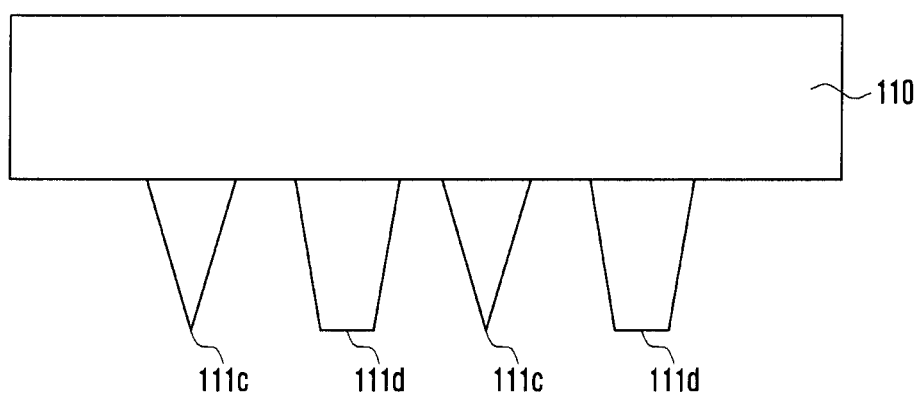

FIG. 10 illustrates protrusions 111 formed in various shapes according to an embodiment of the present disclosure.

For example, the protrusion 111 may include a third protrusion set 111c having a first shape and a fourth protrusion set 111d having a second shape.

For example, the protrusion having a first shape may be formed with a sharp end to increase a bonding depth with an electrode substrate. The protrusion 111 having a second shape may be formed with a flat end to increase a bonding area with an electrode substrate.

As described above, the third protrusion set 111c and the fourth protrusion set 111d may include at least one protrusion.

Figure 11:
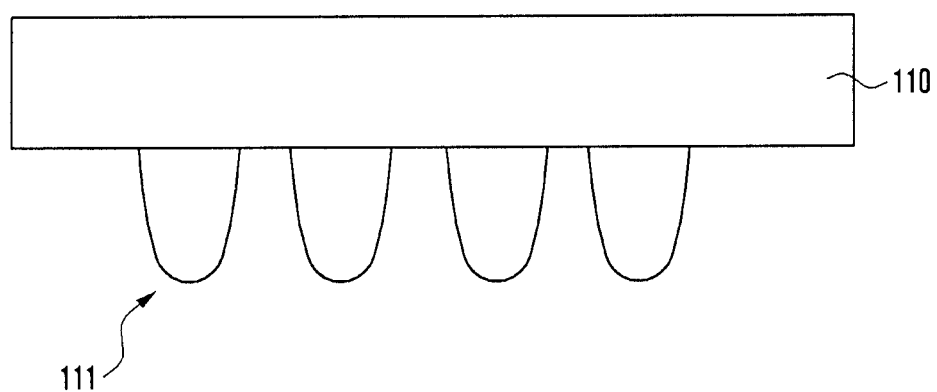

FIG. 11 illustrates one of protrusion shapes according to various embodiments of the present disclosure.

As described above, the shape of protrusion 111 may be formed with a sharp end, flat end, angled end, or round end. Further, the whole shape of protrusion 111 may be formed in a funnel, diamond, rectangular column, rectangular horn, or cylinder shape.

By varying the shapes of protrusions, a bonding depth and a bonding area between an electrode tab and an electrode substrate can be adjusted and, accordingly, a bonding force between the electrode tab and the electrode substrate can be adjusted.

Figure 12:
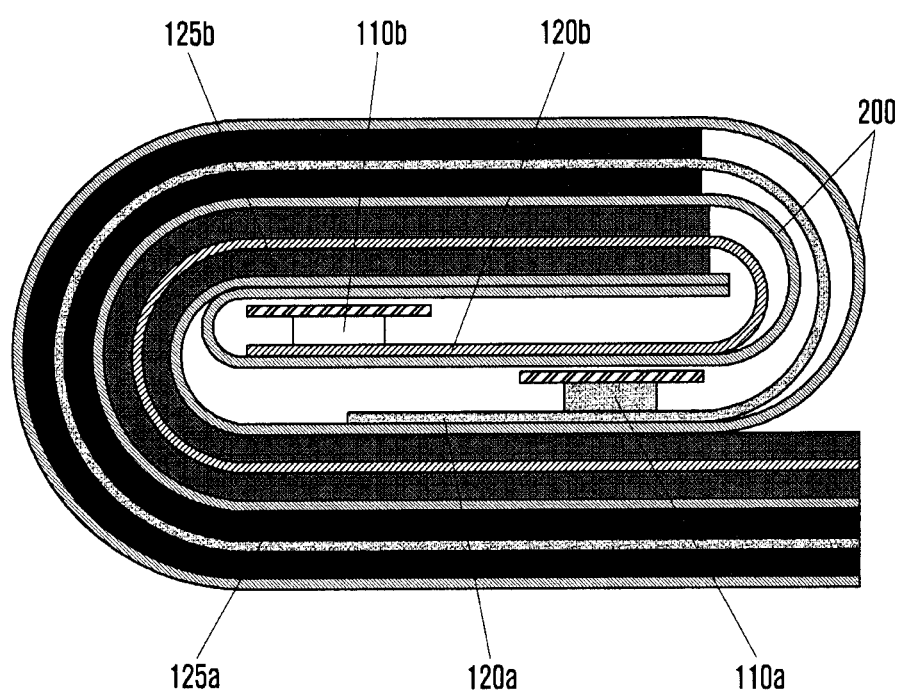
FIG. 12 illustrates a state that an electrode assembly is packed with other members into a battery according to an embodiment.
Figure 13:
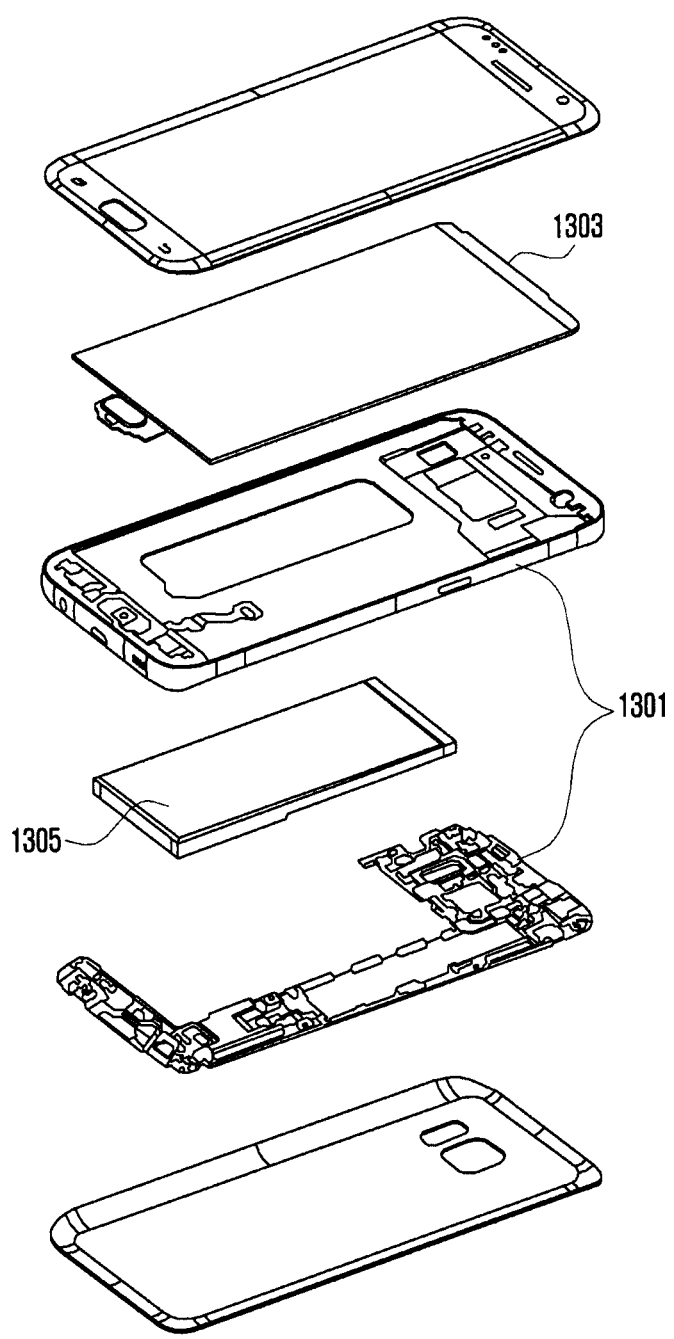
FIG. 13 illustrates an electronic device including a battery according to an embodiment.

FIG. 12 illustrates a battery packaged with an electrode assembly 100 and other members according to an embodiment of the present disclosure, and FIG. 13 illustrates an electronic device embedded with the packaged battery.

The electrode assembly 100 may be used for an anode assembly 101 or a cathode assembly 103 (refer to FIG. 4) according to the active materials 125a and 125b deposited on a partial area of the electrode substrates 120a and 120b. For example, an anode can be manufactured if a lithium-ion material, conductive material for improving a conductivity, and binder for improving a bonding force with the electrode substrate 120 are mixed and deposited, and a cathode can be manufactured if a conductive material, binder, and graphite are mixed and deposited.

A membrane 200 may be located between an anode and a cathode, and a battery can be manufactured by winding and packing in a jelly roll shape as shown in FIG. 12. In order to avoid a short circuit caused by a contact between an anode assembly 101 and a cathode assembly 103 (refer to FIG. 4), an insulation film may be additionally disposed at a surface of the anode assembly 101 or the cathode assembly 103 according to the direction of winding the anode assembly 101, cathode assembly 103, and membrane 200.

Because the surface opposite the bonding surface 113b and the surface opposite the bonding location 123' (refer to FIG. 7) of the electrode substrates 120a and 120b and the electrode tabs 110a and 110b are formed uniformly and smoothly, an influence of the surface opposite the bonding surface 113b and the surface opposite the bonding location 123' to other electrodes can be reduced in the process of winding and packing the electrode assembly.

A battery according to an embodiment of the present disclosure may comprise an anode assembly 101, a cathode assembly 103, and a membrane disposed between the anode assembly and the cathode assembly. The anode assembly 101 or the cathode assembly 103 may comprise an electrode substrate, an active material 125 deposited in a first area 121 of the electrode substrate 120, and an electrode tab 110 attached in second area 123 of the electrode substrate where the active material 125 is not deposited. The bonding surface 113a of the electrode table 110 can comprise at least one protrusion 111 (refer to FIG. 5) formed, thereon contacting the bonding location of the second area of the electrode substrate 120, and a surface opposite the bonding surface 113b of the electrode tab 110 and a surface opposite the bonding location 123' may be substantially flat.

The electrode assembly can be selected from one of a cathode assembly and an anode assembly. The battery further comprises the other of the cathode assembly and the anode assembly; and a membrane disposed between the electrode assembly and the other of the cathode assembly and the anode assembly.

The electrode tab 110 may be fixed to the bonding location 123" by at least one protrusion 111.

A surface of the electrode substrate 120 excluding the bonding location 123" may be substantially flat.

The length of the at least one protrusion 111 (refer to FIG. 5) may be smaller than the thickness of the electrode substrate 120.

The at least one protrusion 111 may comprise at least one first protrusion set 111a having a first length and at least one second protrusion set 111b having a second length (refer to FIG. 9).

The at least one protrusion 111 may comprise at least one third protrusion set 111c having a first shape and at least one fourth protrusion set 111d having a second shape (refer to FIG. 10).

The electrode tab 110 can be attached to the electrode substrate 120 by welding the at least one protrusion 111.

A welding surface 113a (refer to FIG. 7) of the electrode tab 110 and the electrode substrate 120 may be formed in a part of a contacting area of the electrode tab 110 and the electrode substrate 120.

An electronic device comprised according to an embodiment of the present disclosure may comprise a housing 1301, a display 1303 partially accommodated in the housing 1301, and a battery 1305 partially accommodated in the housing (refer to FIG. 13). The battery comprises an electrode assembly, the electrode assembly comprising an electrode substrate comprising a first area and a second area; an active material deposited on the first area of the electrode substrate; and an electrode tab attached to the second area of the electrode substrate, the electrode tab comprising a bonding surface having at least one protrusion contacting a bonding location of the second area of the electrode substrate, and wherein a surface opposite to the bonding surface of the electrode tab and a surface opposite to the bonding location are substantially flat.

The electrode assembly can be selected from one of a cathode assembly and an anode assembly, wherein the battery further comprises the other of the cathode assembly and the anode assembly; and a membrane disposed between the electrode assembly and the other of the cathode assembly and the anode assembly.

The electrode tab 110 can be fixed to the bonding location 123", preventing the membrane 200 (refer to FIG. 4) from being damaged by the at least one protrusion in a state of rolling up the battery.

A surface of the electrode substrate 120 not contacting the electrode tab 110 may be substantially flat.

The length of the at least one protrusion 111 (refer to FIG. 8) of the electronic tab 110 may be smaller than the thickness of the electrode substrate 120.

The at least one protrusion 111 may comprise at least one first protrusion set 111a having a first length and at least one second protrusion set 111b having a second length (refer to FIG. 9).

The at least one protrusion 111 may comprise at least one third protrusion set 111c having a first shape and at least one fourth protrusion set 111d having a second shape (refer to FIG. 10).

The electrode tab 110 can be attached to the electrode substrate 120 by welding the at least one protrusion 111.

A bonding surface 113a (refer to FIG. 7) of the electrode tab 110 can be formed in at least bonding location of the electrode tab 110 and the electrode substrate 120.

Figure 14:
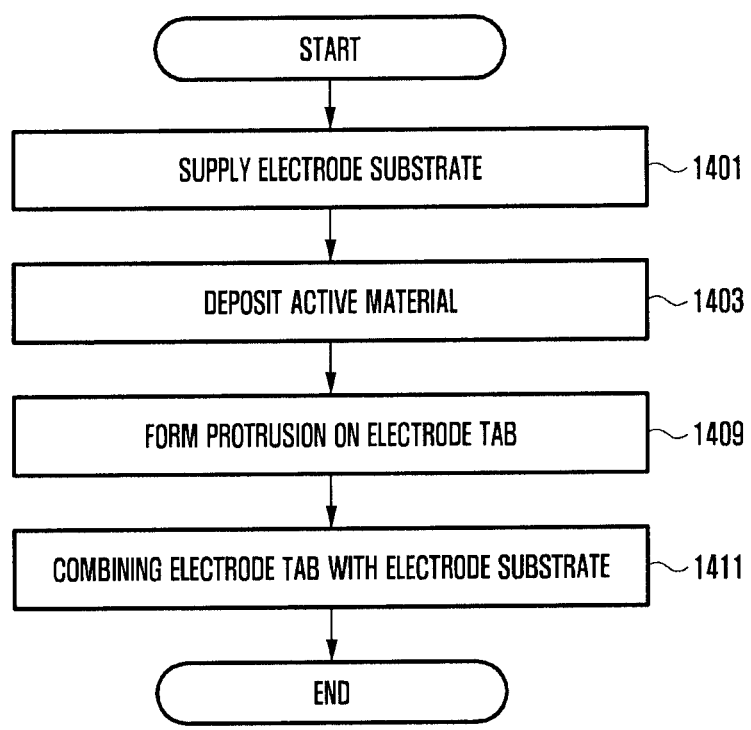
FIG. 14 is a flowchart illustrating a procedure of manufacturing an electrode assembly according to an embodiment.

FIG. 14 is a flowchart illustrating a procedure of manufacturing an electrode assembly according to an embodiment of the present disclosure.

The electrode substrate can be manufactured through an operation 1401 of supplying an electrode substrate and an operation 1403 of depositing an active material to the supplied electrode substrate.

The electrode tab can be manufactured through an operation of supplying an electrode tab sheet, an operation of cutting the supplied sheet according to a designed size of the electrode tab, and an operation 1409 of forming a welding protrusion on a welding surface of the electrode tab.

In more detail, the electrode tab sheet can be used by unwinding a roll at operation. The electrode tab sheet can be used by cutting into a predetermined size with a cutter at operation. The cut electrode tab 110 can be transported by an electrode tab transfer device 150 and processed for a welding protrusion 111 at operation 1409 by pressing with a jig 140 formed with protrusions. The welding part 113 of the electrode tab may mean a welding surface 113a of the electrode tab 110 and a non-welding surface 113b (refer to FIG. 3 and FIG. 7).

The operation 1401 of supplying an electrode substrate and the operation 1403 of depositing an active material on the electrode substrate can be performed after or at the same time as the operation of supplying an electrode tab sheet, the operation of cutting the supplied sheet according to a designed size of the electrode tab, and the operation 1409 of forming a welding protrusion on a welding surface of the electrode tab.

The electrode tab 110 produced through the above procedure can be transported to an electrode substrate 120 with an electrode tab transfer device 150, and the electrode assembly can be manufactured by settling the electrode tab 110 on the electrode substrate 120 and welding the settled part at operation 1411.

The surfaces of the horn 131 and the anvil 133 of the ultrasonic welding device 130 (refer to FIG. 5) used in an ultrasonic welding process may be formed in a practically flat shape corresponding to a contact with the electrode substrate 120 or the electrode tab 110. By this, a non-welding surface 113b (refer to FIG. 7) can be formed uniformly and smoothly.

A method for manufacturing a battery including an anode assembly 101, a cathode assembly 103, and a membrane 200 disposed between the anode assembly 101 and the cathode assembly 103 (refer to FIG. 4) according to an embodiment of the present disclosure may comprise an operation 1401 of supplying an electrode substrate to be used for a pole assembly corresponding to the anode assembly 101 and the cathode assembly 103, an operation 1403 of depositing an active material 125 in a partial area of the electrode substrate, and an operation of attaching an electrode tab in another area of the electrode substrate. The operation of attaching an electrode tab may comprise an operation 1409 of forming at least one protrusion in at least one partial area of a second surface of the electrode tab opposite to a first area of the electrode tab having a practically flat shape, and an operation 1411 of combining the at least one protrusion with the electrode substrate in order to attach the at least one area of the second surface of the electrode tab to the electrode substrate.

The operation 1409 of forming at least one protrusion may comprise an operation of pressing the electrode tab by using a jig formed with a protrusion.

The operation 1411 of combining the at least one protrusion may comprise an operation of welding the at least one protrusion to the electrode substrate by using an ultrasonic wave.

The operation of welding the at least one protrusion may comprise an operation of pressing the electrode tab onto the electrode substrate by using a horn or an anvil formed in a practically flat shape without having a concavo-convex or a protrusion.

The combination of the electrode tab and the electrode substrate can be formed in at least one part of a contacting area between the electrode tab and the electrode substrate.

As described above, the electrode assembly according to an embodiment of the present disclosure can be manufactured by forming a surface of a welding part uniformly and smoothly between an electrode substrate and an electrode tab.

While the present disclosure has been particularly shown and described with reference to an certain embodiments thereof, it will be understood by those skilled in the art that various changes in form and details may be made therein without departing from the spirit and scope of the disclosure as defined by the appended claims.

What is claimed is:

1. A battery comprising:
an electrode assembly, said electrode assembly comprising:
an electrode substrate comprising a first area and a second area;
an active material deposited on the first area of the electrode substrate; and
an electrode tab attached to the second area of the electrode substrate, wherein the electrode tab comprises a bonding surface having at least one protrusion making contacting with a bonding location of the second area of the electrode substrate, wherein a surface opposite to the bonding surface and a surface opposite the bonding location are substantially flat,
wherein the at least one protrusion of the electrode tab comprises a first protrusion set including a plurality of protrusions having a first shape, and a second protrusion set including a plurality of protrusions having a second shape, wherein the first shape is triangular and the second shape is quadrilateral.

2. The battery of claim 1, wherein the at least one protrusion fixes the electrode tab to the bonding location of the second area of the electrode substrate.

3. The battery of claim 1, wherein a surface of the electrode substrate, except the bonding location of the second area, is substantially flat.

4. The battery of claim 1, wherein a length of the at least one protrusion is smaller than a thickness of the electrode substrate.

5. The battery of claim 1, wherein the first protrusion set has a first length and the second protrusion set has a second length.

6. The battery of claim 1, wherein the at least one protrusion further comprises a third protrusion set including a plurality of protrusions having a third shape and a fourth protrusion set including a plurality of protrusions having a fourth shape.

7. The battery of claim 1, wherein the at least one protrusion of the electrode tab is welded to the electrode substrate.

8. The battery of claim 7, wherein a welding surface between the electrode tab and the electrode substrate is formed in a part of a contacting area between the electrode tab and the electrode substrate.

9. An electronic device comprising:
a housing;
a display partially accommodated in the housing; and
a battery partially accommodated in the housing,
wherein the battery comprises:
an electrode assembly, the electrode assembly comprising:
an electrode substrate comprising a first area and a second area;
an active material deposited on the first area of the electrode substrate; and
an electrode tab attached to the second area of the electrode substrate, wherein the electrode tab comprises a bonding surface having at least one protrusion contacting a bonding location of the second area of the electrode substrate, and wherein a surface opposite to the bonding surface of the electrode tab and a surface opposite to the bonding location are substantially flat,
wherein the at least one protrusion of the electrode tab comprises a first protrusion set including a plurality of protrusions having a first shape, and a second protrusion set including a plurality of protrusions having a second shape, wherein the first shape is triangular and the second shape is quadrilateral.

10. The electronic device of claim 9, wherein the at least one protrusion fixes the electrode tab to the bonding location of the second area of the electrode substrate.

11. The electronic device of claim 9, wherein a surface of the electrode substrate excluding the bonding location is substantially flat.

12. The electronic device of claim 9, wherein a length of the at least one protrusion is smaller than a thickness of the electrode substrate.

13. The electronic device of claim 9, wherein the first protrusion set has a first length and the second protrusion set has a second length.

14. The electronic device of claim 9, wherein the at least one protrusion further comprises a third protrusion set including a plurality of protrusions having a third shape and a fourth protrusion set including a plurality of protrusions having a fourth shape.

15. The electronic device of claim 9, wherein the electrode tab is welded to the electrode substrate.

16. The electronic device of claim 9, wherein a welding surface between the electrode tab and the electrode substrate is formed in a part of a contacting area between the electrode tab and the electrode substrate.

* * * * *